US012512871B2

(12) United States Patent
Moon et al.

(10) Patent No.: US 12,512,871 B2
(45) Date of Patent: Dec. 30, 2025

(54) COMMUNICATION CIRCUITRY INCLUDING AMPLIFYING MODULE AND AN ELECTRONIC DEVICE INCLUDING THE COMMUNICATION CIRCUITRY

(71) Applicant: SAMSUNG ELECTRONICS CO., LTD., Suwon-si (KR)

(72) Inventors: John Moon, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 17/993,582

(22) Filed: Nov. 23, 2022

(65) Prior Publication Data

US 2023/0126353 A1   Apr. 27, 2023

Related U.S. Application Data

(63) Continuation of application No. PCT/KR2022/016266, filed on Oct. 24, 2022.

(30) Foreign Application Priority Data

Oct. 22, 2021   (KR) .......................... 10-2021-0141452

(51) Int. Cl.
*H04B 1/401*   (2015.01)
*H04B 1/04*    (2006.01)
*H04B 1/44*    (2006.01)

(52) U.S. Cl.
CPC .............. *H04B 1/401* (2013.01); *H04B 1/04* (2013.01); *H04B 1/44* (2013.01); *H04B 2001/0408* (2013.01)

(58) Field of Classification Search
CPC . H04B 1/401; H04B 1/04; H04B 1/44; H04B 2001/0408; H04B 2001/0416;
(Continued)

(56) References Cited

U.S. PATENT DOCUMENTS 5,590,412 A * 12/1996 Sawai ...................... H03F 3/72
                                                            455/86
5,661,434 A *  8/1997 Brozovich ............ H03F 1/0277
                                                            330/51
(Continued)

FOREIGN PATENT DOCUMENTS

JP        2021-163975        10/2021
KR    10-2004-0022019         3/2004
(Continued)

OTHER PUBLICATIONS

Search Report dated Jan. 31, 2023 in International Patent Application No. PCT/KR2022/016266.
(Continued)

*Primary Examiner* — Kenneth T Lam
(74) *Attorney, Agent, or Firm* — Nixon & Vanderehye, P.C.

(57) ABSTRACT

An electronic device may include a communication processor, a transceiver, an antenna, a power supply module, and a communication circuit. The communication circuit includes an input terminal configured to acquire a signal transmitted from the transceiver, an amplifier module, an output terminal configured to transmit a signal to the transceiver, an antenna terminal connected to the antenna, a first switch connected to the input terminal and the amplifier module, a second switch connected to the amplifier module and the output terminal, and a third switch connected to the first switch, the second switch, and the antenna terminal.

12 Claims, 12 Drawing Sheets

(58) Field of Classification Search
CPC .............. H03F 3/62; H03F 2203/7209; H03F 2203/7236; H03F 2203/7239; H03F 3/245; H03F 2200/451; H03F 3/195; H03F 3/72; H03F 3/211; H03F 3/24; H03F 3/45475; H03F 3/68; H03G 3/3036; H03G 3/3052

See application file for complete search history.

(56) References Cited

U.S. PATENT DOCUMENTS

| | | | |
|---|---|---|---|
| 9,954,491 B2 | 4/2018 | Wallis | |
| 10,056,875 B1 | 8/2018 | Beaudin et al. | |
| 10,491,176 B1 | 11/2019 | Hur et al. | |
| 11,901,924 B2* | 2/2024 | Voor | H04B 1/04 |
| 2002/0098812 A1* | 7/2002 | Sourour | H03F 3/68 |
| | | | 455/114.2 |
| 2004/0043731 A1* | 3/2004 | Xiong | H04B 1/44 |
| | | | 455/78 |
| 2004/0048591 A1 | 3/2004 | Kim et al. | |
| 2006/0267682 A1* | 11/2006 | Grebennikov | H03F 1/0277 |
| | | | 330/51 |
| 2008/0108312 A1* | 5/2008 | Viorel | H04B 1/44 |
| | | | 455/7 |
| 2008/0218260 A1* | 9/2008 | Quaglietta | H03F 1/56 |
| | | | 330/126 |
| 2009/0091383 A1* | 4/2009 | Jeon | H03F 3/005 |
| | | | 330/86 |
| 2009/0278597 A1* | 11/2009 | Zhang | H03F 3/387 |
| | | | 330/9 |
| 2013/0136213 A1* | 5/2013 | Kobayashi | H03F 3/72 |
| | | | 375/340 |
| 2015/0015339 A1* | 1/2015 | Gorbachov | H03G 3/3042 |
| | | | 330/291 |
| 2015/0372652 A1* | 12/2015 | Kitamura | H03F 1/42 |
| | | | 330/253 |
| 2016/0056767 A1* | 2/2016 | Wang | H03F 3/211 |
| | | | 330/251 |
| 2016/0142020 A1* | 5/2016 | Wang | H03F 3/19 |
| | | | 330/295 |
| 2018/0102740 A1 | 4/2018 | Chang et al. | |
| 2018/0145648 A1* | 5/2018 | Ye | H03F 3/211 |
| 2018/0226932 A1* | 8/2018 | Beaudin | H04W 52/0261 |
| 2018/0248526 A1* | 8/2018 | Lee | H03F 3/21 |
| 2018/0337697 A1 | 11/2018 | Kim et al. | |
| 2019/0068147 A1* | 2/2019 | Nakano | H03F 3/2171 |
| 2019/0089396 A1* | 3/2019 | Kim | H04B 1/3805 |
| 2019/0288825 A1* | 9/2019 | Kang | H03F 3/24 |
| 2020/0021024 A1 | 1/2020 | Park et al. | |
| 2020/0067559 A1* | 2/2020 | Wich | H03F 3/19 |
| 2020/0127698 A1* | 4/2020 | Cho | H04B 1/0057 |
| 2020/0195199 A1 | 6/2020 | Cannella et al. | |
| 2020/0274508 A1* | 8/2020 | Beppu | H03F 3/19 |
| 2021/0013632 A1 | 1/2021 | Lee et al. | |
| 2021/0111675 A1 | 4/2021 | Lee et al. | |
| 2021/0211146 A1 | 7/2021 | Park et al. | |
| 2021/0234522 A1* | 7/2021 | Lee | H03F 3/72 |
| 2021/0306013 A1 | 9/2021 | Ono et al. | |
| 2022/0352908 A1* | 11/2022 | Hoogzaad | H04B 1/006 |
| 2023/0089409 A1 | 3/2023 | Woo | |
| 2023/0179233 A1* | 6/2023 | Kitajima | H04B 1/0057 |
| | | | 455/552.1 |

FOREIGN PATENT DOCUMENTS

| | | |
|---|---|---|
| KR | 10-2017-0068947 | 6/2017 |
| KR | 10-2019-0028915 | 3/2019 |
| KR | 10-2021-0006157 | 1/2021 |
| KR | 10-2021-0088855 | 7/2021 |
| KR | 10-2021-0095365 | 8/2021 |
| KR | 10-2022-0062044 | 5/2022 |

OTHER PUBLICATIONS

Written Opinion dated Jan. 31, 2023 in International Patent Application No. PCT/KR2022/016266.
Extended Search Report dated Nov. 12, 2024 in European Patent Application No. 22884129.2.

* cited by examiner

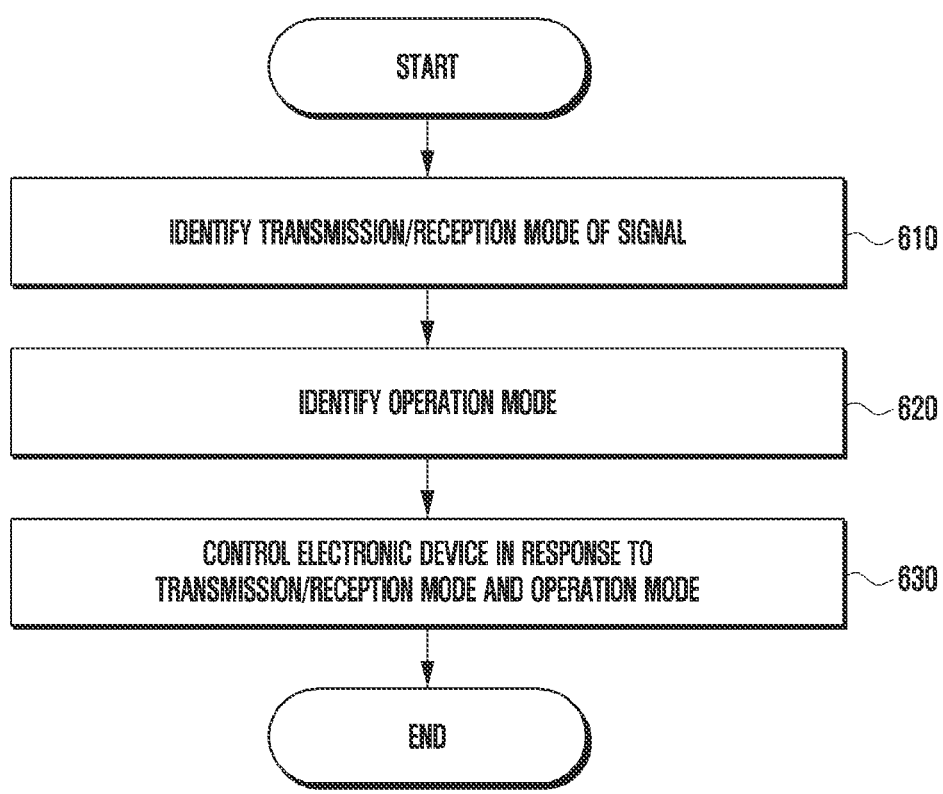

COMMUNICATION CIRCUITRY INCLUDING AMPLIFYING MODULE AND AN ELECTRONIC DEVICE INCLUDING THE COMMUNICATION CIRCUITRY

CROSS-REFERENCE TO RELATED APPLICATIONS

This application is a continuation of International Application No. PCT/KR2022/016266 designating the United States, filed on Oct. 24, 2022, in the Korean Intellectual Property Receiving Office and claiming priority to Korean Patent Application No. 10-2021-0141452, filed on Oct. 22, 2021, in the Korean Intellectual Property Office, the disclosures of which are incorporated by reference herein in their entireties.

BACKGROUND

Field

The disclosure relates to a communication circuit including an amplifier module, and an electronic device.

Description of Related Art

Various electronic devices such as a smartphone, tablet PC, portable multimedia player (PMP), personal digital assistant (PDA), laptop personal computer (PC), or wearable device are in widespread use.

An electronic device may include a communication circuit for communication with an external electronic device, and the communication circuit may include an amplifier module for amplifying transmitted signals. Electronic devices supporting communication schemes such as LTE and Sub6 may include time duplex division (TDD) type communication circuits which use identical frequencies with regard to transmitted and received signals, and which distinguish use time slots.

A general TDD communication circuit may include a power amp (PA) connected to the Tx so as to amplify transmitted signals, and a low-noise amplification (LNA) connected to the RX so as to amplify received signals. In addition, the TDD communication circuit may include a power supply device for supplying power to the PA and a power supply device for supplying power to the LNA, respectively.

SUMMARY

Many TDD bands are used for communication circuits supporting LTE and Sub6. In general, TDD bands include both a power amp and an LNA at radio-frequency front ends to support the Tx and Rx. This may increase the size of the amplifier end.

An electronic device according to various embodiments disclosed herein may include a PA supporting the Tx and an LNA supporting the Rx, as a single amplifier block.

Technical problems to be solved by the disclosure are not limited to the above-mentioned technical problems, and other advantages not mentioned herein will be clearly understood from the following description.

An electronic device according to various embodiments may include a communication processor, a transceiver, an antenna, a power supply module, and a communication circuit, wherein the communication circuit includes an input terminal configured to acquire a signal transmitted from the transceiver, an amplifier module, an output terminal configured to transmit a signal to the transceiver, an antenna terminal connected to the antenna, a first switch connected to the input terminal and the amplifier module, a second switch connected to the amplifier module and the output terminal, and a third switch connected to the first switch, the second switch, and the antenna terminal.

An amplifier module according to various embodiments may include an input terminal configured to acquire a signal, a first amplifier group including at least one first amplifier, a second amplifier group including at least one second amplifier and a bypass path, and amplifying a signal amplified by the first amplifier, and an output terminal configured to output the amplified signal, wherein the amplifier module is configured to control the connection among the input terminal, the first amplifier group, the second amplifier group, and the output terminal, based on a transmission/reception mode of a signal and an operation mode related to an amplification magnification of a signal.

An electronic device according to various embodiments may use a PA supporting a Tx and an LNA supporting an Rx as a single amplifier block.

An electronic device according to various embodiments may provide a communication circuit having an amplifier module, the size and structure of which are simplified.

An electronic device according to various embodiments may control an amplifier module in response to a signal reception or transmission mode.

An electronic device according to various embodiments may control an amplifier module in response to a signal amplification magnification mode.

An electronic device according to various embodiments may control a power supply device so as to supply power to an amplifier module in response to a transmission/reception mode.

An electronic device according to various embodiments may control a power supply device so as to operate in an envelope tracking (ET) mode or average power tracking (APT) mode in response to a signal amplification magnification mode.

Technical problems to be solved by the disclosure are not limited to the above-mentioned technical problems, and other advantages not mentioned herein will be clearly understood from the following description.

BRIEF DESCRIPTION OF THE DRAWINGS

In connection with the description of the drawings, the same or similar reference numerals may be used for the same or similar components.

The above and other aspects, features and advantages of certain embodiments of the present disclosure will be more apparent from the following detailed description, taken in conjunction with the accompanying drawings, in which:

FIG. 6 is a flowchart illustrating an example method in which a communication processor controls an electronic device in response to a transmission/reception mode of a signal according to various embodiments;

DETAILED DESCRIPTION

Figure 1:
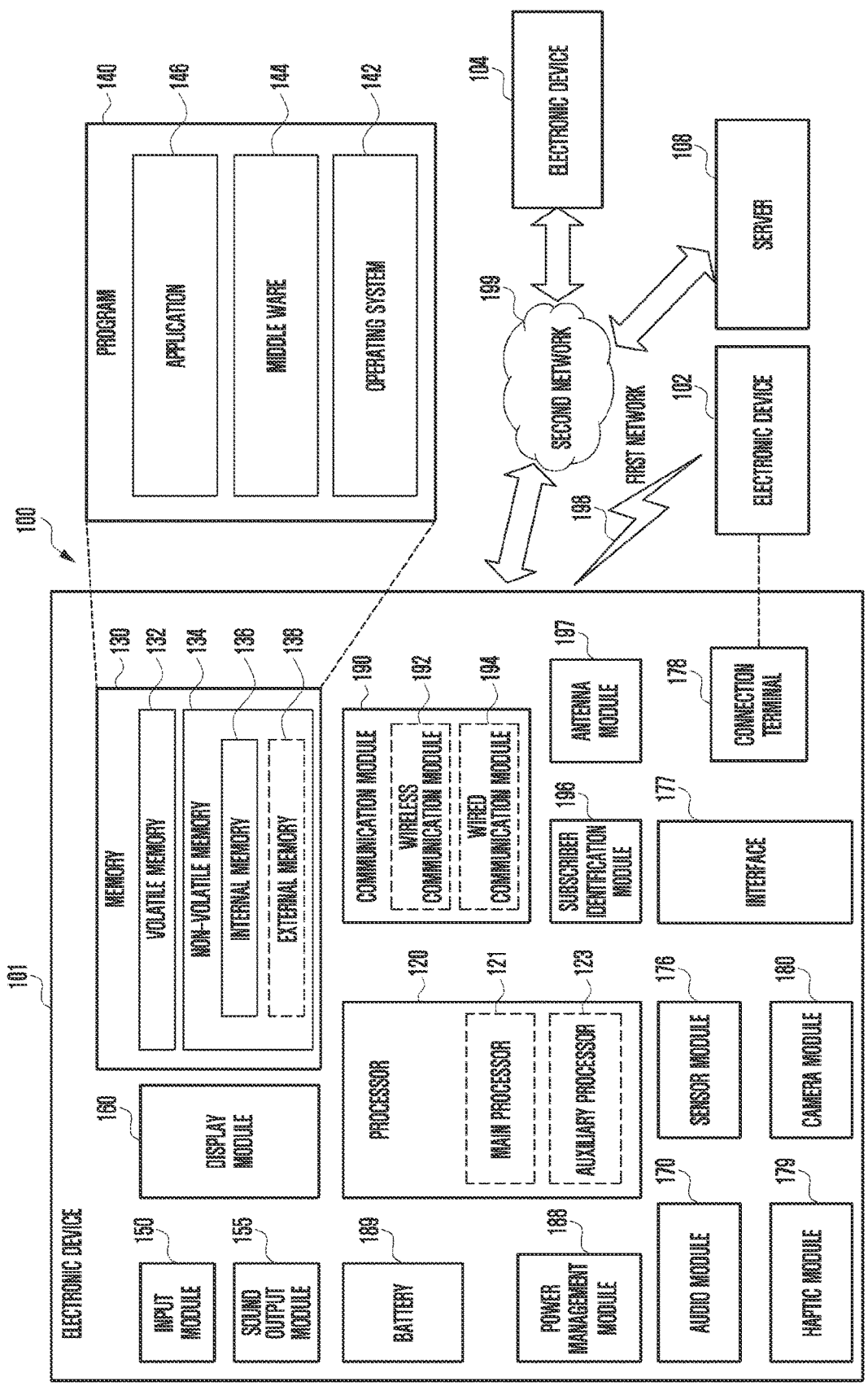
FIG. 1 is a block diagram of an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
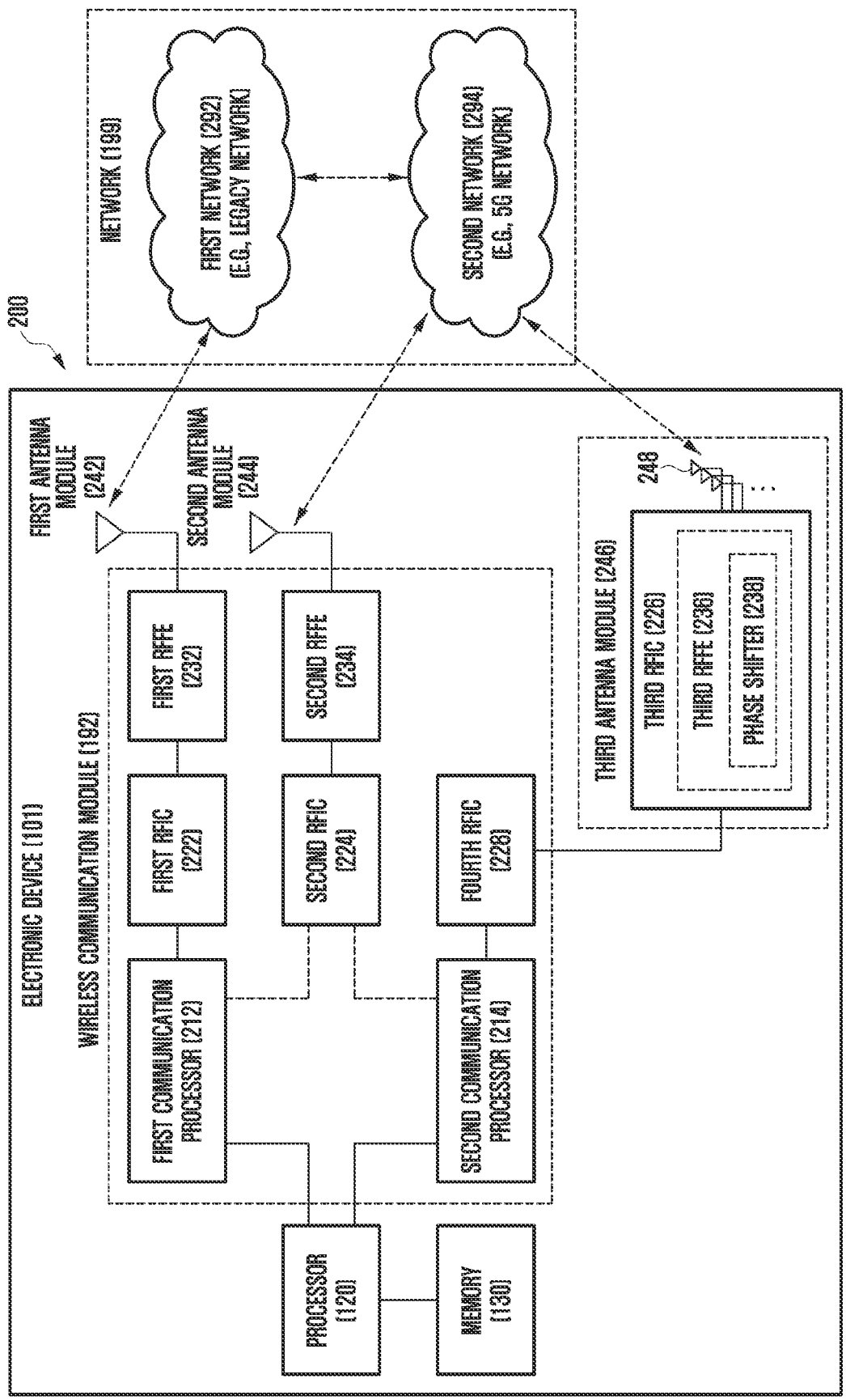
FIG. 2 is a block diagram of an example electronic device for supporting legacy network communication and 5G network communication according to various embodiments.

FIG. 2 is a block diagram of an example electronic device 101 for supporting legacy network communication and 5G network communication according to various embodiments. Referring to FIG. 2, the electronic device 101 may include a first communication processor 212, a second communication processor 214, a first radio frequency integrated circuit (RFIC) 222, a second RFIC 224, and a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. The network 199 may include a first network 292 and a second network 294. According to an embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to an embodiment, the fourth RFIC 228 may be omitted or included as a part of the third RFIC 226.

The first communication processor 212 may support establishment of a communication channel of a band to be used for wireless communication with the first network 292, and may support legacy network communication through the established communication channel According to various embodiments, the first network may be a legacy network including a second generation (2G), 3G, 4G, or long term evolution (LTE) networks. The second communication processor 214 may support establishment of a communication channel corresponding to a designated band (e.g., about 6 GHz to about 60 GHz) among bands to be used for wireless communication with the second network 294, and may support 5G network communication through the established communication channel. According to various embodiments, the second network 294 may be a 5G network defined by 3GPP. Additionally, according to an embodiment, the first communication processor 212 or the second communication processor 214 may support establishment of a communication channel corresponding to another designated band (e.g., about 6 GHz or less) among the bands to be used for wireless communication with the second network 294, and may support 5G network communication through the established communication channel According to an embodiment, the first communication processor 212 and the second communication processor 214 may be implemented in a single chip or a single package. According to various embodiments, the first communication processor 212 or the second communication processor 214 may be formed in a single chip or a single package with the processor 120, an auxiliary processor 123, or a communication module 190.

Upon transmission, the first RFIC 222 may convert a baseband signal generated by the first communication processor 212 into a radio frequency (RF) signal of about 700 MHz to about 3 GHz used in the first network 292 (e.g., legacy network).

Upon reception, the RF signal may be acquired from the first network 292 (e.g., legacy network) via an antenna (e.g., first antenna module 242) and may be preprocessed through an RFFE (e.g., the first RFFE 232). The first RFIC 222 may convert the preprocessed RF signal into a baseband signal so as to be processed by the first communication processor 212.

Upon transmission, the second RFIC 224 may convert a baseband signal generated by the first communication processor 212 or the second communication processor 214 into an RF signal in a Sub6 band (hereinafter, referred to as "5G Sub6 RF signal") (e.g., about 6 GHz or less) used in the second network 294 (e.g., 5G network). Upon reception, the 5G Sub6 RF signal may be acquired from the second network 294 (e.g., 5G network) through an antenna (e.g., the second antenna module 244), and may be preprocessed through an RFFE (e.g., the second RFFE 234). The second RFIC 224 may convert the preprocessed 5G Sub6 RF signal into a baseband signal so as to be processed by the corresponding communication processor of either the first communication processor 212 or the second communication processor 214.

The third RFIC 226 may convert a baseband signal generated by the second communication processor 214 into an RF signal in a 5G Above6 band (hereinafter, referred to as "5G Above6 RF signal") (e.g., about 6 GHz to about 60 GHz) to be used in the second network 294 (e.g., 5G network). Upon reception, the 5G Above6 RF signal may be acquired from the second network 294 (e.g., 5G network) through an antenna (e.g., the antenna 248), and may be preprocessed through the third RFFE 236. The third RFIC 226 may convert the preprocessed 5G Above6 RF signal into a baseband signal so as to be processed by the second communication processor 214. According to an embodiment, the third RFFE 236 may be formed as a part of the third RFIC 226.

According to an embodiment, the electronic device 101 may include the fourth RFIC 228 separately from or at least as a part of the third RFIC 226. Here, the fourth RFIC 228 may convert a baseband signal generated by the second communication processor 214 into an RF signal in an intermediate frequency band (hereinafter, referred to as "IF signal") (e.g., about 9 GHz to about 11 GHz), and may then transmit the IF signal to the third RFIC 226. The third RFIC 226 may convert the IF signal into the 5G Above6 RF signal. Upon reception, the 5G Above6 RF signal may be received from the second network 294 (e.g., 5G network) through an antenna (e.g., the antenna 248) and may be converted into an IF signal by the third RFIC 226. The fourth RFIC 228 may convert the IF signal into a baseband signal so as to be processed by the second communication processor 214.

According to an embodiment, the first RFIC 222 and the second RFIC 224 may be implemented as at least a portion of a single chip or a single package. According to an embodiment, the first RFFE 232 and the second RFFE 234 may be implemented as at least a portion of a single chip or a single package. According to an embodiment, at least one antenna module of the first antenna module 242 or the second antenna module 244 may be omitted or combined with another antenna module to process RF signals of a corresponding plurality of bands.

According to an embodiment, the third RFIC 226 and the antenna 248 may be disposed on the same substrate to form a third antenna module 246. For example, the wireless communication module 192 or the processor 120 may be disposed on a first substrate (e.g., main PCB). Here, the third RFIC 226 may be disposed in a partial region (e.g., lower surface) of a second substrate (e.g., sub PCB) that is separate from the first substrate and the antenna 248 may be disposed in another partial region (e.g., upper surface) thereof so that the third antenna module 246 may be formed. By placing the third RFIC 226 and the antenna 248 in the same substrate, it is possible to reduce the length of a transmission line therebetween. This may reduce, for example, a loss (e.g., attenuation) of a signal in a high frequency band (e.g., about 6 GHz to about 60 GHz) used for 5G network communication due to the transmission line. As a result, the electronic device 101 may improve the quality or speed of communication with the second network 294 (e.g., 5G network).

According to an embodiment, the antenna 248 may be formed as an antenna array including a plurality of antenna elements that may be used for beamforming. Here, the third RFIC 226 may include a plurality of phase shifters 238 corresponding to the plurality of antenna elements, for example, as a part of the third RFFE 236. Upon transmission, each of the plurality of phase shifters 238 may convert the phase of a 5G Above6 RF signal to be transmitted to the outside of the electronic device 101 (e.g., a base station (BS) of a 5G network) through a corresponding antenna element. Upon reception, each of the plurality of phase shifters 238 may convert the phase of the 5G Above6 RF signal received from the outside into the same or substantially the same phase through the corresponding antenna element. This may enable transmission or reception through beamforming between the electronic device 101 and the outside.

The second network 294 (e.g., 5G network) may operate independently of (e.g., stand-alone (SA)) the first network 292 (e.g., legacy network), or may operate in conjunction with the first network 292 (e.g., non-standalone (NSA)). For example, in the 5G network, there may be only an access network (e.g., 5G radio access network (RAN) or next generation RAN (NG RAN)), but there may be no core network (e.g., next generation core (NGC)). Here, the electronic device 101 may access the access network of a 5G network and may then access an external network (e.g., the Internet) under the control of a core network (e.g., evolved packed core (EPC)) of a legacy network. Protocol information (e.g., LTE protocol information) for communication with the legacy network or protocol information (e.g., new radio (NR) protocol information) for communication with the 5G network may be stored in the memory 230, and may be accessed by other components (e.g., the processor 120, the first communication processor 212, or the second communication processor 214).

Figure 3:
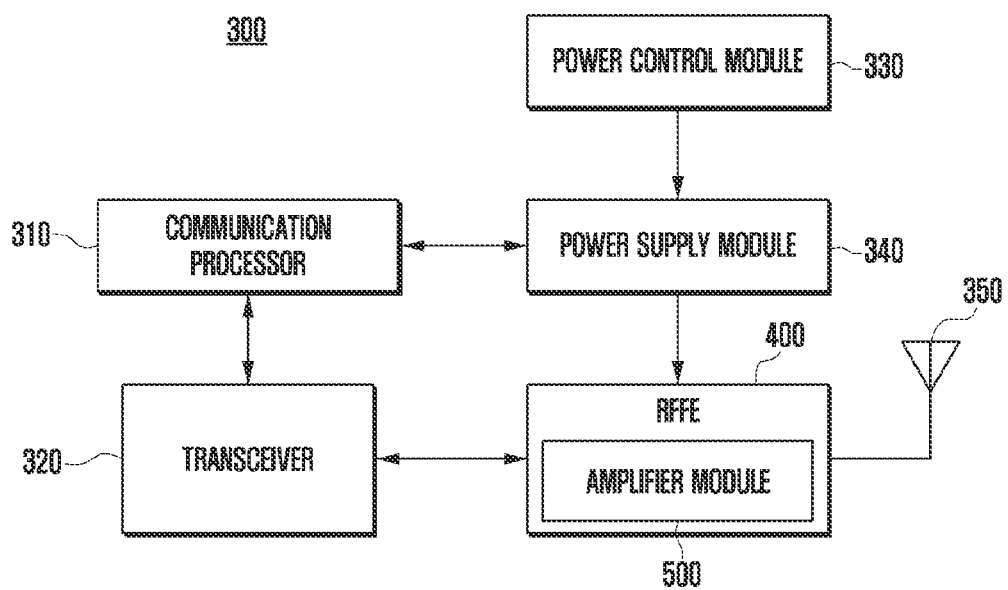
FIG. 3 is a block diagram of an example electronic device according to various embodiments.

FIG. 3 is a block diagram of an example electronic device 300 according to various embodiments.

Referring to FIG. 3, the electronic device 300 (e.g., the electronic device 101 of FIG. 2) may include a communication processor 310 (e.g., the first communication processor 212 of FIG. 2 and/or the second communication processor 214 of FIG. 2), a transceiver 320 (e.g., the first RFIC 222, the second RFIC 224, and/or the fourth RFIC 228 of FIG. 2), a power control module 330, a power supply module 340, a radio frequency front end module (RFFE) (e.g., the first RFFE 232 and/or the second RFFE 234 of FIG. 2) 400, and/or an antenna (e.g., the first antenna module 242, the second antenna module 244, or the third antenna module 246 of FIG. 2) 350. The elements included in FIG. 3 are for some of the components included in the electronic device 300, and the electronic device 300 may also include various other elements as shown in FIGS. 1 and/or 2. Although one RFFE 400 and an antenna 350 are illustrated in FIG. 3, the electronic device 300 may include a plurality of RFFEs and a plurality of antennas.

The communication processor 310 according to various embodiments may be configured to receive or transmit control data or user data through short-range wireless communication (e.g., Wi-Fi or Bluetooth) or cellular wireless communication (e.g., 4G mobile communication or 5G mobile communication).

The communication processor 301 may establish a cellular communication connection with a base station through control data, may transmit data received from the application processor (e.g., the processor 120 of FIG. 1) to the base station through the established cellular communication, or may transmit data received from the base station to the application processor 120.

The communication processor 310 according to various embodiments may control the transceiver 320, the RFFE 400, or the power supply module 340 based on the transmission/reception mode and/or the operation mode. For example, in response to the transmission/reception mode being at least one of a transmission mode and a reception mode, and the operation mode being at least one of a high-gain mode and a low-gain mode, the communication processor 310 may control the transceiver 320, the RFFE 400, or the power supply module 340.

The transceiver 320 according to various embodiments may perform various operations for processing a signal received from the communication processor 310. For example, the transceiver 320 may perform a modulation operation for a signal received from the communication processor 310. For example, the transceiver 320 may perform a frequency modulation operation for converting a baseband signal into a radio frequency (RF) signal used for cellular communication.

The transceiver 320 according to various embodiments may perform various operations of processing a signal received from the outside. For example, the transceiver 320 may perform a demodulation operation of a signal received from the antenna 350 through the RFFE 400. For example, the transceiver 320 may perform a frequency demodulation operation for converting a radio frequency (RF) signal into a signal of a baseband.

The power control module 330 according to various embodiments may control power supplied to the RFFE 400.

The power supply module 340 according to various embodiments may supply power to the RFFE 400.

The power supply module 340 according to an embodiment may supply power to the RFFE 400 based on the control of the communication processor 310.

The power supply module 340 may supply power to the RFFE 400 based on the control of the communication processor 310 according to the transmission/reception mode and/or the operation mode. For example, the power supply module 340 may supply power corresponding to a high-gain transmission mode to the RFFE 400 based on the control of the communication processor 310. For example, the power supply module 340 may supply power corresponding to a low-gain transmission mode to the RFFE 400 based on the control of the communication processor 310. For example, the power supply module 340 may supply power corresponding to a high-gain reception mode to the RFFE 400 based on the control of the communication processor 310. For example, the power supply module 340 may supply power corresponding to a low-gain reception mode to the RFFE 400 based on the control of the communication processor 310.

The power supply module 340 according to an embodiment may operate in an envelope tracking mode (ET) or an average power tracking mode (APT) based on the control of the communication processor 310. The power supply module 340 may operate in the ET mode or the APT mode based on the control of the communication processor 310 according to the transmission/reception mode and/or the operation mode.

The RFFE 400 according to various embodiments may be a radio frequency front end (RFFE) of a time division duplex (TDD) scheme.

The RFFE 400 according to various embodiments may include at least one RF chain for outputting a signal through the antenna 350. For example, the RF chain may refer to a set of various components included in a signal movement path. The RF chain may include, for example, various components (e.g., an amplifier, a switch, or a filter) for amplifying a signal transmitted by the transceiver 320 and filtering the amplified signal.

The RFFE 400 according to various embodiments may include at least one RF chain for processing a signal acquired from the antenna 350. For example, the RF chain may refer to a set of various components included in a signal movement path. For example, the RF chain may include various components (e.g., an amplifier, a switch, or a filter) for filtering a signal acquired from the antenna 350 and amplifying the filtered signal.

The RFFE 400 will be described below with reference to FIG. 4.

According to various embodiments, the RFFE 400 may include an amplifier module 500 for amplifying a signal of a frequency band. The amplifier module 500 may be a component included in the RF chain. The amplifier module 500 may include at least one amplifier for amplifying a signal. For example, the amplifier module 500 may be implemented as a multi-stage amplifier structure for amplifying a signal in multiple stages.

The amplifier module 500 will be described below with reference to FIG. 5.

The antenna 350 according to various embodiments may transmit or receive a signal to or from an external electronic device.

The antenna 350 according to an embodiment may, in response to a transmission mode, transmit a signal to the outside, the signal obtained by converting a baseband signal into a radio frequency (RF) signal by the transceiver 320 and then amplifying and processing the RF signal by the RFFE 400.

The antenna 350 according to an embodiment may, in response to a reception mode, receive a radio frequency (RF) signal from the outside, and may transfer the RF signal to the RFFE 400 so as to be amplified and processed by the RFFE 400 and then to be converted into a baseband signal by the transceiver 320.

Figure 4:
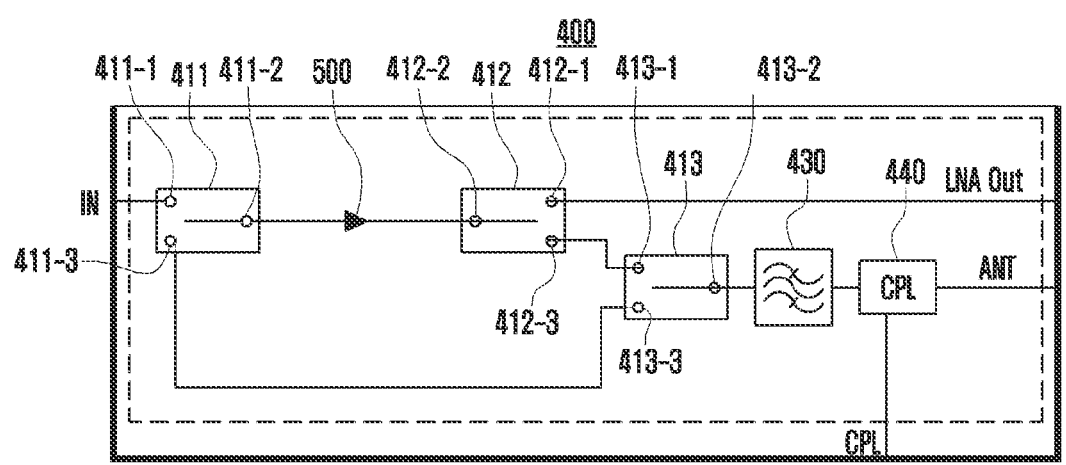
FIG. 4 illustrates an example communication circuit including an RFFE according to various embodiments.

FIG. 4 illustrates an example communication circuit including an RFFE 400 according to various embodiments.

The communication circuit including the RFFE 400 according to various embodiments may include: an amplifier module 500 for amplifying a signal transmitted by a transceiver (e.g., the transceiver 320 of FIG. 3) and/or amplifying a signal obtained from an antenna (e.g., the antenna 350 of FIG. 3); a CPL 440, which is a complementary pass-transistor logic; a BPF 430, which is a band-pass filter for passing only a signal of a designated frequency band; an input terminal (IN) which has acquired a signal from the transceiver 320; a first switch 411 for controlling the connection among the amplifier module 500 and the third switch 413; a second switch 412 for controlling the connection among the amplifier module 500, the third switch 413, and the LNA output terminal (LNA out); and a third switch 413 for controlling the connection among the first switch 411, the second switch 412, and the antenna 350. The first switch 411 may include a first port 411-1, a second port 411-2, and/or a third port 411-3. The second switch 412 may include a first port 412-1, a second port 412-2, and/or a third port 412-3. The third switch 413 may include a first port 413-1, a second port 413-2, and/or a third port 413-3.

According to various embodiments, the amplifier module 500 may be an amplifier for amplifying a signal transmitted by the transceiver 320 and/or a signal acquired from the antenna 350. The amplifier module 500 may operate by a voltage applied by a power supply circuit (e.g., the power supply module 340 of FIG. 3) implemented in a communication circuit.

According to an embodiment, the amplifier module 500 may be an amplifier for amplifying a signal acquired from the input terminal IN. For example, the amplifier module 500 may be an amplifier for amplifying a signal transmitted by the transceiver 320. The signal, which is amplified by the amplifier module 500, may pass through various components, such as the second switch 412, the third switch 413, a BPF 430, and/or a CPL 440 and then output to the ANT terminal, thereby being output through the antenna (e.g., the antenna 350 of FIG. 3).

According to an embodiment, the amplifier module 500 may be an amplifier for amplifying a signal acquired from the ANT terminal. For example, the amplifier module 500 may be an amplifier for amplifying a signal, which is acquired from the antenna 350 and then passed through various components such as the CPL 440, the BPF 430, and/or the first switch 411. The signal amplified by the amplifier module 500 may be output to the LNA output terminal through the second switch 412 and transmitted to a transceiver (e.g., the transceiver 320 of FIG. 3).

According to various embodiments of the disclosure, the RFFE 400 may control the connection among the input terminal IN, the amplifier module 500, the LNA output terminal (LNA out), and/or the ANT terminal (ANT) based on the transmission/reception mode. For example, the communication processor (e.g., the communication processor 310 of FIG. 3) and/or the RFFE 400 may control the first switch 411 to be in a first state and/or a second state. The first state of the first switch 411 may be a state in which a first port 411-1 and a second port 411-2 are connected and thus the input terminal (IN) and the amplifier module 500 are connected. For example, the second state of the first switch 411 may be a state in which the second port 411-2 and a third port 411-3 are connected and thus the third switch 413 and the amplifier module 500 are connected. For example, the communication processor 310 and/or the RFFE 400 may control the second switch 412 to be in a first state and/or a second state. The first state of the second switch 412 may be a state in which the first port 412-1 and the second port 412-2 are connected and thus the amplifier module 500 and the LNA output terminal (LNA out) are connected. The second state of the second switch 412 may be a state in which the second port 412-2 and the third port 412-3 are connected and thus the amplifier module 500 and the third switch 413 are connected.

For example, the communication processor 310 and/or the RFFE 400 may control the third switch 413 to be in a first state and/or a second state. The first state of the third switch 413 may be a state in which the first port 413-1 and the second port 413-2 are connected and thus the second switch 412 and the BPF 430 are connected. The second state of the third switch 413 may be a state in which the second port 413-2 and the third port 413-3 are connected and thus the first switch 411 and the BPF 430 are connected. According to an embodiment, the communication processor 310 may control the RFFE 400 so that the RFFE 400 outputs a signal, which is transmitted from the transceiver 320, through the antenna 350 in response to a transmission mode. For example, the communication processor 310 may control the RFFE 400 so that the input terminal IN, the amplifier module 500, and the ANT terminal are electrically connected in order for the RFFE 400 to transmit a signal. The communication processor 310 or RFFE 400 may be configured to switch the first switch 411 to the first state, the second switch 412 to the second state, and the third switch 413 to the first state by controlling the first switch 411, the second switch 412, and the third switch 413, so as to allow the input terminal IN, the amplifier module 500, and the ANT terminal to be electrically connected. A signal input through the input terminal (IN) may be amplified by the amplifier module 500. The signal amplified by the amplifier module 500 may be output through the ANT terminal. The signal, which is amplified by the amplifier module 500 and passed through the second switch 412, the third switch 413, the BPF 430, and/or the CPL 440, and then output to the ANT terminal, may be output through the antenna 350.

According to an embodiment, the communication processor 310 may control the RFFE 400 so that the RFFE 400 transmits a signal acquired from the antenna 350 to the transceiver 320, in response to a reception mode. For example, the communication processor 310 may control the RFFE 400 so that the ANT terminal, the amplifier module 500, and the LNA output terminal are electrically connected, in order for the RFFE 400 to receive a signal. The communication processor 310 or RFFE 400 may be configured to switch the third switch 413 to the second state, the first switch 411 to the second state, and the second switch 412 to the first state by controlling the third switch 413, the first switch 411, and the second switch 412, so as to allow the ANT terminal, the amplifier module 500, and the LNA output terminal to be electrically connected. A signal input through the ANT terminal may pass through the CPL 440, the BPF 430, the third switch 413, and the first switch 411 and then amplified by the amplifier module 500. The signal amplified by the amplifier module 500 may be output to the LNA output terminal through the second switch 412. The signal output to the LNA output terminal may be transmitted to the transceiver 320.

Figure 5:
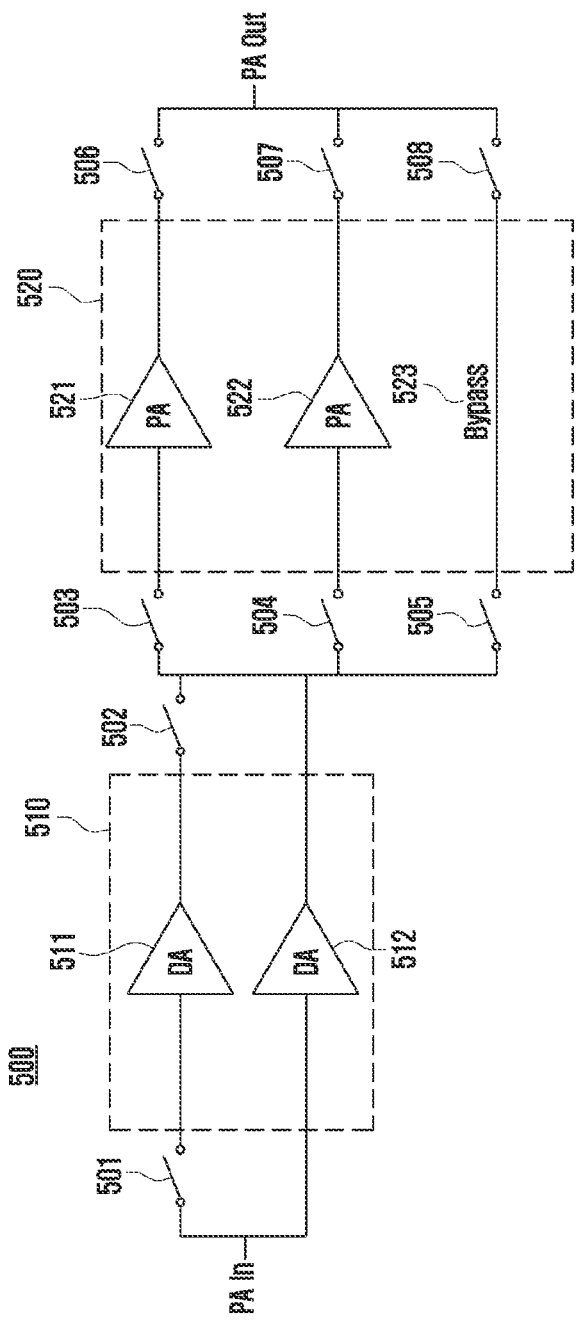
FIG. 5 illustrates an example amplifier module according to various embodiments.

FIG. 5 illustrates an example amplifier module 500 according to various embodiments.

According to various embodiments, the amplifier module 500 may include a first amplifier group 510 for amplifying an input signal and a second amplifier group 520 for re-amplifying the signal amplified by the first amplifier group 510.

The amplifier module 500 according to various embodiments may support multi-stage amplification. The amplifier module 500 may support multi-stage amplification including a first amplifier group 510 for performing the first stage of amplification and a second amplifier group 520 for performing the second stage of amplification. The number of amplifiers included in the first amplifier group 510 and the second amplifier group 520 may, for example, be determined by a designer in consideration of the required strength of a signal to be amplified and the disclosure is not limited to any particular number of amplifiers in the first and second amplifier groups.

According to an embodiment, the first amplifier group 510 may be an amplifier amplifying an input signal. For example, the first amplifier group 510 may be implemented as at least one drive amplifier.

According to an embodiment, the second amplifier group 520 may include an amplifier for re-amplifying the signal amplified by the first amplifier group 510. For example, the second amplifier group 520 may include at least one power amplifier that may have a higher gain than that of the first amplifier group 510.

According to various embodiments, the amplifier module 500 may control the connection among a PA input stage, a first drive amplifier 511, a second drive amplifier 512, a first power amplifier 521, and a second power amplifier 522, a bypass 523, and/or a PA output terminal (PA out) based on a transmission/reception mode and/or an operation mode.

According to an embodiment, the communication processor (e.g., the communication processor 310 of FIG. 3) may control the amplifier module 500 so that the amplifier module 500 amplifies a signal, which is acquired from the transceiver 320, with a high gain in response to a high-power transmission mode. For example, the communication processor 310 may control the amplifier module 500 so that a PA input terminal, a first drive amplifier 511, a second drive amplifier 512, a first power amplifier 521, and a second power amplifier 522, and a PA output terminal (PA out) are electrically connected in order for the amplifier module 500 to amplify a signal with a high gain. The communication processor 310 or amplifier module 500 may be configured to switch a first amplifier switch 501 to a closed state, a second amplifier switch 502 to a closed state, a third amplifier switch 503 to a closed state, a fourth amplifier switch 504 to a closed state, and a fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input terminal (PA in), the first drive amplifier 511, the second drive amplifier 512, the first power amplifier 521, and the second power amplifier 522, and the PA output terminal (PA out) to be electrically connected. A signal input through the PA input terminal (PA in) may be amplified by the first drive amplifier 511 and the second drive amplifier 512. The signal amplified by the first drive amplifier 511 and the second drive amplifier 512 may be amplified through the first power amplifier 521 and the second power amplifier 522. The signal, which is amplified by the first power amplifier 521 and the second power amplifier 522, may be output through the PA output terminal (PA out) and then passed through a BPF (e.g., the BPF 430 of FIG. 4 and/or a CPL (e.g., the CPL 440 of FIG. 4), thereby being output through the antenna (e.g., the antenna 350 of FIG. 3).

According to an embodiment, the communication processor 310 may control the amplifier module 500 so that the amplifier module 500 amplifies a signal, which is acquired from the transceiver 320, with a low gain in response to a low-gain transmission mode. For example, the communication processor 310 may control the amplifier module 500 so that a PA input terminal (PA in), a second drive amplifier 512, a second power amplifier 522, and a PA output terminal (PA out) are electrically connected in order for the amplifier module 500 to amplify a signal with a low gain. The communication processor 310 or amplifier module 500 may be configured to switch a first amplifier switch 501 to an opened state, a second amplifier switch 502 to an opened state, a third amplifier switch 503 to an opened state, a fourth amplifier switch 504 to a closed state, and a fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input terminal (PA in), the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified through the second power amplifier 522. The signal, which is amplified by the second power amplifier 522, may be output through the PA output terminal (PA out) and then passed through a BPF (e.g., the BPF 430 of FIG. 4 and/or a CPL (e.g., the CPL 440 of FIG. 4), thereby being output through the antenna (e.g., the antenna 350 of FIG. 3).

According to an embodiment, the communication processor 310 may control the amplifier module 500 so that the amplifier module 500 amplifies a signal, which is acquired from the antenna 350, with a high gain in response to a high-gain reception mode. For example, the communication processor 310 may control the amplifier module 500 so that a PA input terminal (PA in), a second drive amplifier 512, a second power amplifier 522, and a PA output terminal (PA out) are electrically connected in order for the amplifier module 500 to amplify a signal with a high gain. The communication processor 310 or amplifier module 500 may be configured to switch a first amplifier switch 501 to an opened state, a second amplifier switch 502 to an opened state, a third amplifier switch 503 to an opened state, a fourth amplifier switch 504 to a closed state, and a fifth amplifier switch 505 to an opened state by controlling the first amplifier switch 501, the second amplifier switch 502, the third amplifier switch 503, the fourth amplifier switch 504, and/or the fifth amplifier switch 505, so as to allow the input terminal, the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified through the second power amplifier 522. The signal, which is amplified by the second power amplifier 522, may be output through the PA output terminal (PA out) and then transmitted to the transceiver 320.

According to an embodiment, the communication processor 310 may control the amplifier module 500 so that the amplifier module 500 amplifies a signal, which is acquired from the antenna 350, with a low gain in response to a low-gain reception mode. For example, the communication processor 310 may control the amplifier module 500 so that a PA input terminal (PA in), a second drive amplifier 512, and a PA output terminal (PA out) are connected in order for the amplifier module 500 to amplify a signal with a low gain. The communication processor 310 or amplifier module 500 may be configured to switch a first amplifier switch 501 to an opened state, a second amplifier switch 502 to an opened state, a third amplifier switch 503 to an opened state, a fourth amplifier switch 504 to an opened state, and a fifth amplifier switch 505 to a closed state by controlling the first amplifier switch 501, the second amplifier switch 502, the third amplifier switch 503, the fourth amplifier switch 504, and/or the fifth amplifier switch 505, so as to allow the PA input terminal (PA in), the second drive amplifier 512, and the PA output terminal (PA out) to be electrically connected. A signal input through the PA input terminal (PA in) may be amplified by the second drive amplifier 512. The signal, which is amplified by the second drive amplifier 512, may be output through the PA output terminal (PA out) and then transmitted to the transceiver 320.

FIG. 6 is a flowchart illustrating an example method in which a communication processor (e.g., the communication processor 310 of FIG. 3) controls an electronic device (e.g., the electronic device 300 of FIG. 3) in response to a transmission/reception mode of a signal according to various embodiments.

The communication processor 310 according to various embodiments may identify a transmission/reception mode of a signal in operation 610.

The communication processor 310 may identity a transmission mode of a signal, which is transmitted from a transceiver (e.g., the transceiver 320 of FIG. 3) and amplified and processed through an RFFE (e.g., the RFFE 400 of FIG. 4), and then output to an antenna module (e.g., the antenna 350 of FIG. 3), or a reception mode of a signal, which is acquired from the antenna 350 and amplified and processed through the RFFE 400, and then transferred to the transceiver 320.

The communication processor 310 according to various embodiments may identify an operation mode in operation 620.

For example, the communication processor 310 may identify a high-gain transmission mode or a low-gain transmission mode in response to a transmission mode of a signal. As another example, the communication processor 310 may identify a high-gain reception mode or a low-gain reception mode in response to a reception mode of a signal.

In operation 630, the communication processor 310 according to various embodiments may control the electronic device 300 in response to a transmission/reception mode and an operation mode of a signal.

The communication processor 310 according to an embodiment may control the power supply module 340, a first switch (e.g., the first switch 411 of FIG. 4), a second switch (e.g., the second switch 412 of FIG. 4), a third switch (e.g., the second switch 413 of FIG. 4), and an amplifier module (e.g., the amplifier module 500 of FIG. 5) in response to the transmission/reception mode and the operation mode of the signal.

The communication processor 310 according to an embodiment may control the first switch 411, the second switch 412, and the third switch 413 in response to a transmission mode. For example, the communication processor (e.g., the communication processor 310 of FIG. 3) may be configured to control the RFFE 400 such that the RFFE 400 outputs a signal, which is transmitted from the transceiver 320, through the antenna 350 in response to a transmission mode. For example, the communication processor 310 may control the RFFE 400 such that the input terminal, the amplifier module 500, and the ANT terminal are connected in order for the RFFE 400 to transmit a signal. The communication processor 310 or the RFFE 400 may be configured to switch the first switch 411 to the first state, the second switch 412 to the second state, and the third switch 413 to the first state by controlling the first switch 411, the second switch 412, and the third switch 413, so as to allow the input terminal, the amplifier module 500, and the ANT terminal to be electrically connected. A signal input through the input terminal may be amplified by the amplifier module 500. The signal amplified by the amplifier module 500 may be output through the ANT terminal. The signal amplified by the amplifier module 500 may pass through the second switch 412, the third switch 413, a BPF (e.g., the BPF 430 in FIG. 4), and/or a CPL (e.g., the CPL 440 in FIG. 4) and then be output to the ANT terminal, thereby being output through the antenna 350.

The communication processor according to an embodiment may control the power supply module 340 and/or the amplifier module 500 in response to a high-gain transmission mode. For example, the communication processor 310 may control the power supply module 340 to supply power corresponding to the high-gain transmission mode to the RFFE 400.

For example, the communication processor 310 may control the amplifier module 500 so as to amplify a signal, which is acquired from the transceiver 320, with a high gain in response to a high-power transmission mode. For example, the communication processor 310 may control the amplifier module 500, in order for the amplifier module 500 to amplify a signal with a high gain, so that a PA input terminal (PA in), a first drive amplifier (e.g., the first drive amplifier 511 of FIG. 5), a second drive amplifier (e.g., the second drive amplifier 512 of FIG. 5), a first power amplifier (e.g., the first power amplifier 521 of FIG. 5), a second power amplifier (e.g., the second power amplifier 522 of FIG. 5), and a PA output terminal (PA out) are connected. The communication processor 310 or the amplifier module 500 may be configured to switch the first amplifier switch (e.g., the first amplifier switch 501 of FIG. 5) to a closed state, the second amplifier switch (e.g., the second amplifier switch of FIG. 5) 502 to a closed state, the third amplifier switch (e.g., the third amplifier switch 503 of FIG. 5) to a closed state, the fourth amplifier switch (e.g., the fourth amplifier switch 504 of FIG. 5) to a closed state, and the fifth amplifier switch (e.g., the fifth amplifier switch (e.g., the fifth amplifier switch 505 of FIG. 5) to an opened state by controlling the first amplifier switch 501, the second amplifier switch 502, the third amplifier switch 503, the fourth amplifier switch 504, and/or the fifth amplifier switch 505, so as to allow the PA input stage (PA in), the first drive amplifier 511, the second drive amplifier 512, the first power amplifier 521, the second power amplifier 522, and the PA output terminal (PA out) to be electrically connected. A signal input through the PA input terminal (PA in) may be amplified by the first drive amplifier 511 and the second drive amplifier 512. The signal amplified by the first drive amplifier 511 and the second drive amplifier 512 may be amplified by the first power amplifier 521 and the second power amplifier 522. The signal amplified by the first power amplifier 521 and the second power amplifier 522 may be output through the PA output terminal (PA out) and then pass through the BPF (e.g., the BPF 430 of FIG. 4) and/or the CPL (e.g., the CPL 440 of FIG. 4), thereby being output through the antenna (e.g., the antenna 350 of FIG. 3).

The communication processor according to an embodiment may control, in response to a low-gain transmission mode, the power supply module 340, the first switch 411, the second switch 412, the third switch 413, and the amplifier module 500. For example, the communication processor 310 may control the power supply module 340 so as to supply power corresponding to the low-gain transmission mode to the RFFE 400.

For example, the communication processor 310 may control the amplifier module 500 so as to amplify a signal, which is acquired from the transceiver 320, with a low gain in response to the low-gain transmission mode. For example, the communication processor 310 may control the amplifier module 500, in order for the amplifier module 500 to amplify the signal with a low gain, so that a PA input terminal (PA in), a second drive amplifier 512, a second power amplifier 522, and a PA output terminal (PA out) are connected. The communication processor 310 or the amplifier module 500 may be configured to switch the first amplifier switch 501 to an opened state, the second amplifier switch 502 to an opened state, the third amplifier switch 503 to an opened state, the fourth amplifier 504 switch to a closed state, and the fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input stage (PA in), the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified by the second power amplifier 522. The signal amplified by the second power amplifier 522 may be output through the PA output terminal (PA out) and then pass through the BPF (e.g., the BPF 430 of FIG. 4) and/or the CPL (e.g., the CPL 440 of FIG. 4), thereby being output through the antenna (e.g., the antenna 350 of FIG. 3).

The communication processor 310 according to an embodiment may control the first switch 411, the second switch 412, and the third switch 413 in response to a reception mode.

According to an embodiment, the communication processor 410 may control the RFFE 400 so as to transmit a signal, which is acquired from the antenna 350, to the transceiver 320 in response to a reception mode. For example, the communication processor 310 may control the RFFE 400 so that the ANT terminal, the amplifier module 500, and the LNA output terminal are connected in order for the RFFE 400 to receive a signal. The communication processor 310 or RFFE 400 may be configured to switch the third switch 413 to the second state, the first switch 411 to the second state, and the second switch 412 to the first state by controlling the third switch 413, the first switch 411, and the second switch 412, so as to allow the ANT terminal, the amplifier module 500, and the LNA output terminal to be electrically connected. A signal input through the ANT terminal may pass through the CPL 440, the BPF 430, the third switch 413, and the first switch 411 and then be amplified by the amplifier module 500. The signal amplified by the amplifier module 500 may be output to the LNA output terminal through the second switch 412. The signal output to the LNA output terminal may be transmitted to the transceiver 320.

The communication processor 310 according to an embodiment may control, in response to a high gain reception mode, the power supply module 340, the first switch 411, the second switch 412, the third switch 413, and the amplifier module 500.

For example, the communication processor 310 may control the power supply module 340 so as to supply power corresponding to the high gain reception mode to the RFFE 400.

For example, the communication processor 310 may control the amplifier module 500 so as to amplify a signal, which is acquired from the antenna 350, with a high gain in response to the high gain reception mode. For example, the communication processor 310 may control the amplifier module 500, in order for the amplifier module 500 to amplify the signal with a high gain, so that a PA input terminal (PA in), a second drive amplifier 512, a second power amplifier 522, and a PA output terminal (PA out) are connected. The communication processor 310 or the amplifier module 500 may be configured to switch the first amplifier switch 501 to an opened state, the second amplifier switch 502 to an opened state, the third amplifier switch 503 to an opened state, the fourth amplifier switch 504 to a closed state, and the fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input stage (PA in), the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified by the second power amplifier 522. The signal amplified by the second power amplifier 522 may be output through the PA output terminal (PA out) and then transmitted to the transceiver 320.

The communication processor according to an embodiment may control, in response to a low-gain transmission mode, the power supply module 340, the first switch 411, the second switch 412, the third switch 413, and the amplifier module 500.

For example, the communication processor 310 may control the power supply module 340 so as to supply power corresponding to the low-gain transmission mode to the RFFE 400.

For example, the communication processor 310 may control the amplifier module 500 so as to amplify a signal, which is acquired from the transceiver 320, with a low gain in response to the low-gain transmission mode. For example, the communication processor 310 may control the amplifier module 500, in order for the amplifier module 500 to amplify the signal with a low gain, so that a PA input terminal (PA in), a second drive amplifier 512, and a PA output terminal (PA out) are connected. The communication processor 310 or the amplifier module 500 may be configured to switch the first amplifier switch 501 to an opened state, the second amplifier switch 502 to an opened state, the third amplifier switch 503 to an opened state, the fourth amplifier switch 504 to an opened state, and the fifth amplifier switch 505 to a closed state by controlling the first amplifier switch 501, the second amplifier switch 502, the third amplifier switch 503, the fourth amplifier switch 504, and/or the fifth amplifier switch 505, so as to allow the PA input stage (PA in), the second drive amplifier 512, and the PA output terminal (PA out) to be electrically connected. A signal input through the PA input terminal (PA in) may be amplified by the second drive amplifier 512. The signal amplified by the second drive amplifier 512 may be output through the PA output terminal (PA out) and then transmitted to the transceiver 320.

Figure 7A:
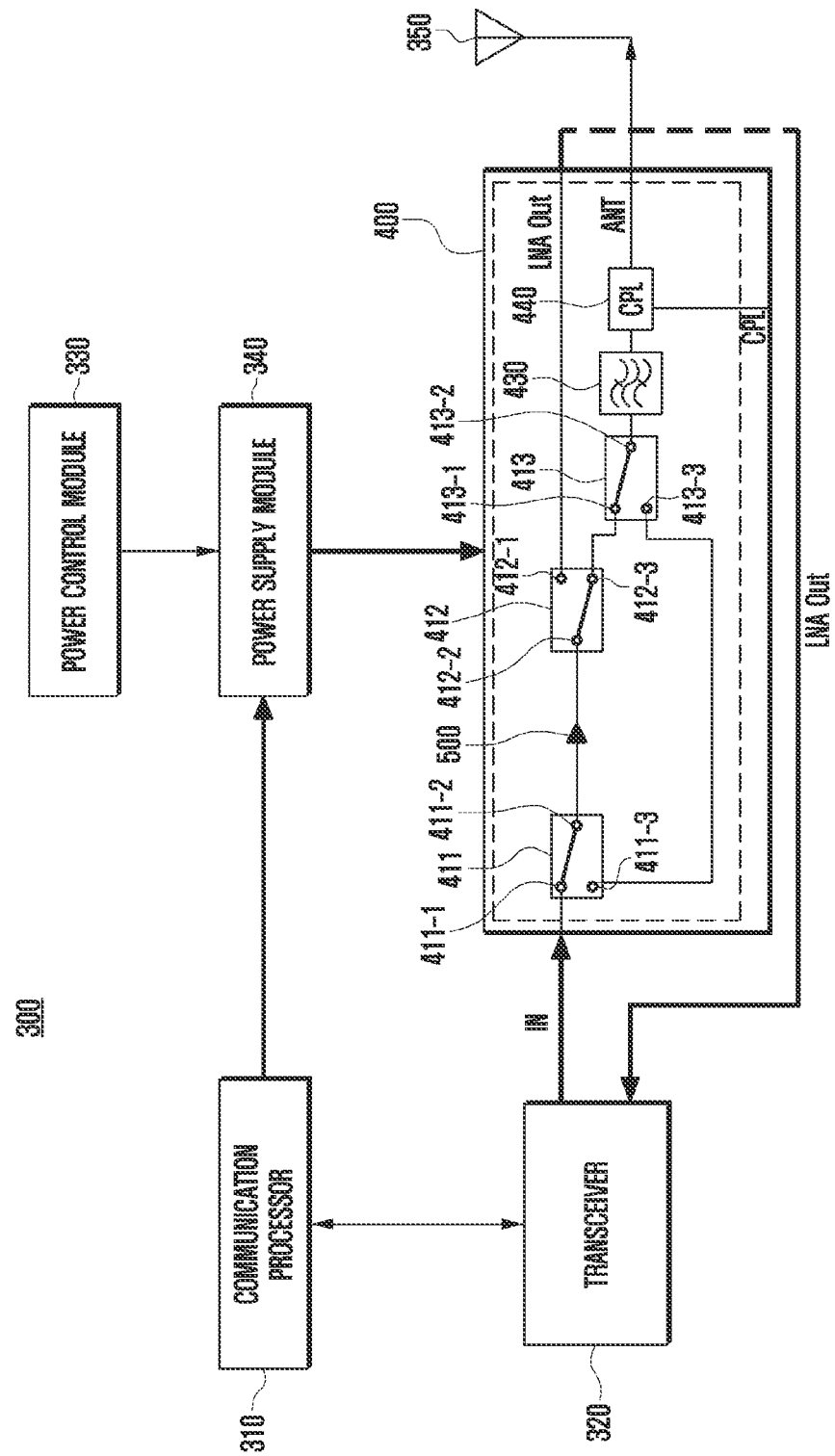
FIG. 7A is a block diagram of an example electronic device, which is controlled by a communication processor in response to a transmission mode of a signal, according to various embodiments.

FIG. 7A is a block diagram of an example electronic device 300, which is controlled by a communication processor 310 in response to a transmission mode of a signal according to various embodiments.

According to an embodiment, the communication processor 310 may control the RFFE 400 so that the RFFE 400 outputs a signal, which is transmitted from the transceiver 320, through the antenna 350 in response to a transmission mode.

For example, the communication processor 310 may control the first switch 411 to be in a first state and/or a second state. The first state of the first switch 411 may be a state in which a first port 411-1 and a second port 411-2 are connected and thus the input terminal (IN) and the amplifier module 500 are connected. The second state of the first switch 411 may be a state in which the second port 411-2 and a third port 411-3 are connected and thus the third switch 413 and the amplifier module 500 are connected.

For example, the communication processor 310 may control the second switch 412 to be in a first state and/or a second state. The first state of the second switch 412 may be a state in which the first port 412-1 and the second port 412-2 are connected and thus the amplifier module 500 and the LNA output terminal (LNA out) are connected. The second state of the second switch 412 may be a state in which the second port 412-2 and the third port 412-3 are connected and thus the amplifier module 500 and the third switch 413 are connected.

For example, the communication processor 310 may control the third switch 413 to be in a first state and/or a second state. The first state of the third switch 413 may be a state in which the first port 413-1 and the second port 413-2 are connected and thus the second switch 412 and the BPF 430 are connected. The second state of the third switch 413 may be a state in which the second port 413-2 and the third port 413-3 are connected and thus the first switch 411 and the BPF 430 are connected.

For example, the communication processor 310 may control the RFFE 400 so that the input terminal IN, the amplifier module 500, and the ANT terminal are electrically connected in order for the RFFE 400 to transmit a signal. The communication processor 310 or RFFE 400 may be configured to switch the first switch 411 to the first state, the second switch 412 to the second state, and the third switch 413 to the first state by controlling the first switch 411, the second switch 412, and the third switch 413, so as to allow the input terminal (IN), the amplifier module 500, and the ANT terminal to be electrically connected. A signal input through the input terminal (IN) may be amplified by the amplifier module 500. The signal amplified by the amplifier module 500 may be output through the ANT terminal. The signal, which is amplified by the amplifier module 500, may pass through the second switch 412, the third switch 413, the BPF 430, and/or the CPL 440 and then be output to the ANT terminal, thereby being output through the antenna 350.

The power supply module 340 according to an embodiment may supply power to the RFFE 400 based on the control of the communication processor 310. The power supply module 340 may supply power to the RFFE 400 based on the control of the communication processor 310 according to the transmission/reception mode and/or the operation mode. For example, the power supply module 340 may supply power corresponding to the high-gain transmission mode to the RFFE 400 based on the control of the communication processor 310.

The power supply module 340 according to an embodiment may operate in an envelope tracking mode (ET) or an average power tracking mode (APT) based on the control of the communication processor 310. The power supply module 340 may operate in the ET mode or the APT mode based on the control of the communication processor 310 according to the transmission/reception mode and/or the operation mode.

Figure 7B:
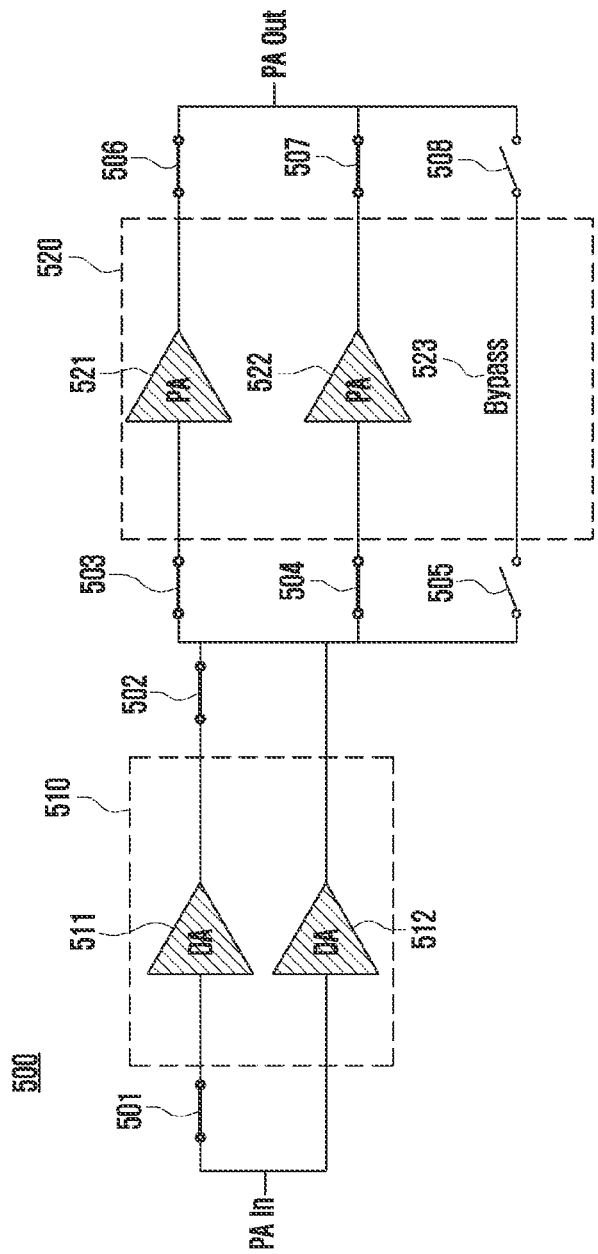
FIG. 7B is a block diagram of an example amplifier module, which is controlled by a communication processor in response to a high-gain transmission mode, according to various embodiments.

FIG. 7B is a block diagram of the example amplifier module 500, which is controlled by the communication processor 310 in response to a high-gain transmission mode according to various embodiments.

According to an embodiment, a communication processor (e.g., the communication processor 310 of FIG. 3) may control the amplifier module 500 so as to amplify a signal, which is acquired from the transceiver 320, with a high gain in response to a high-power transmission mode. For example, the communication processor 310 may control the amplifier module 500, in order for the amplifier module 500 to amplify the signal with a high gain, so that a PA input terminal (PA in), a first drive amplifier 511, a second drive amplifier 512, a first power amplifier 521, a second power amplifier 522, and a PA output terminal (PA out) are connected. The communication processor 310 or the amplifier module 500 may be configured to switch the first amplifier switch 501 to a closed state, the second amplifier switch 502 to a closed state, the third amplifier switch 503 to a closed state, the fourth amplifier switch 504 to a closed state, and the fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input stage (PA in), the first drive amplifier 511, the second drive amplifier 512, the first power amplifier 521, the second power amplifier 522, and the PA output terminal (PA out) to be electrically connected. A signal input through the PA input terminal (PA in) may be amplified by the first drive amplifier 511 and the second drive amplifier 512. The signal amplified by the first drive amplifier 511 and the second drive amplifier 512 may be amplified by the first power amplifier 521 and the second power amplifier 522. The signal amplified by the first power amplifier 521 and the second power amplifier 522 may be output through the output terminal and then pass through the BPF (e.g., the BPF 430 of FIG. 4) and/or the CPL (e.g., the CPL 440 of FIG. 4), thereby being output through the antenna (e.g., the antenna 350 of FIG. 3).

Figure 7C:
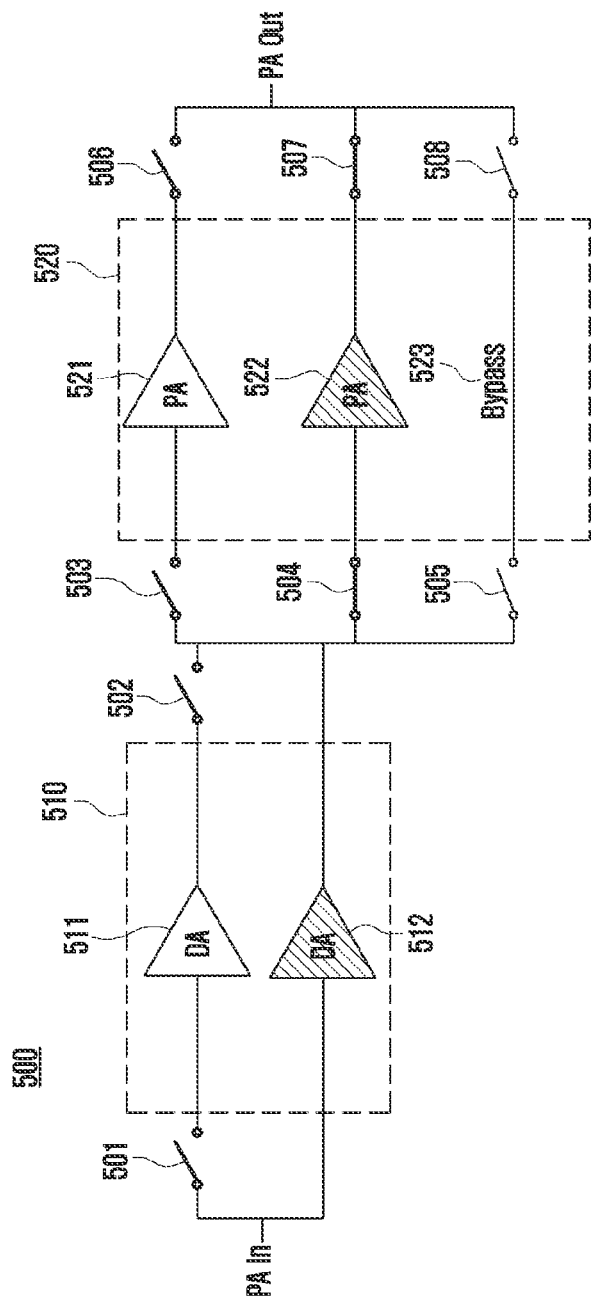
FIG. 7C is a block diagram of an amplifier module, which is controlled by a communication processor in response to a low-gain transmission mode, according to various embodiments.

FIG. 7C is a block diagram of the example amplifier module 500, which is controlled by the communication processor 310 in response to a low-gain transmission mode according to various embodiments.

According to an embodiment, the communication processor 310 may control the amplifier module 500 so as to amplify a signal, which is acquired from the transceiver 320, with a low gain in response to a low-gain transmission mode. For example, the communication processor 310 may control the amplifier module 500, in order for the amplifier module 500 to amplify the signal with a low gain, so that a PA input terminal (PA in), a second drive amplifier 512, a second power amplifier 522, and a PA output terminal (PA out) are connected. The communication processor 310 or the amplifier module 500 may be configured to switch the first amplifier switch 501 to an opened state, the second amplifier switch 502 to an opened state, the third amplifier switch 503 to an opened state, the fourth amplifier switch 504 to a closed state, and the fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input stage (PA in), the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified by the second power amplifier 522. The signal amplified by the second power amplifier 522 may be output through the PA output terminal (PA out) and then pass through the BPF (e.g., the BPF 430 of FIG. 4) and/or the CPL (e.g., the CPL 440 of FIG. 4), thereby being output through the antenna (e.g., the antenna 350 of FIG. 3).

Figure 8A:
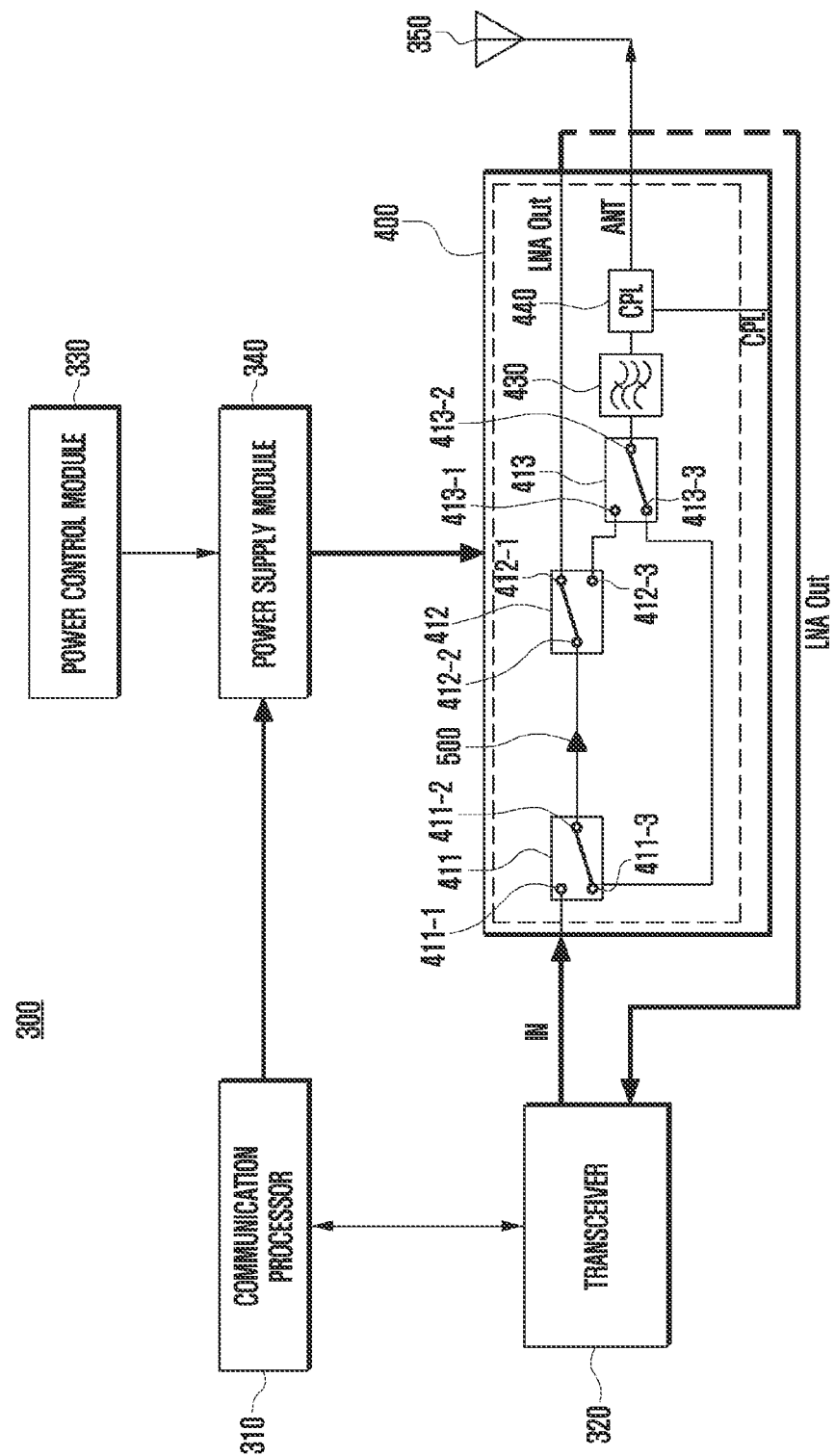
FIG. 8A is a block diagram of an example electronic device, which is controlled by a communication processor in response to a reception mode of a signal, according to various embodiments.

FIG. 8A is a block diagram of an example electronic device 200, which is controlled by the communication processor 310 in response to a reception mode of a signal according to various embodiments.

According to an embodiment, the communication processor 310 may control the RFFE 400 so that the RFFE 400 transmits a signal acquired from the antenna 350 to the transceiver 320, in response to a reception mode.

For example, the communication processor 310 may control the first switch 411 to be in a first state and/or a second state. The first state of the first switch 411 may be a state in which a first port 411-1 and a second port 411-2 are connected and thus the input terminal (IN) and the amplifier module 500 are connected. The second state of the first switch 411 may be a state in which the second port 411-2 and a third port 411-3 are connected and thus the third switch 413 and the amplifier module 500 are connected.

For example, the communication processor 310 may control the second switch 412 to be in a first state and/or a second state. The first state of the second switch 412 may be a state in which a first port 412-1 and a second port 412-2 are connected and thus the amplifier module 500 and the LNA output terminal (LNA out) are connected. The second state of the second switch 412 may be a state in which the second port 412-2 and a third port 412-3 are connected and thus the amplifier module 500 and the third switch 413 are connected.

For example, the communication processor 310 may control the third switch 413 to be in a first state and/or a second state. The first state of the third switch 413 may be a state in which the first port 413-1 and the second port 413-2 are connected and thus the second switch 412 and the BPF 430 are connected. The second state of the third switch 413 may be a state in which the second port 413-2 and a third port 413-3 are connected and thus the first switch 411 and the BPF 430 are connected.

For example, the communication processor 310 may control the RFFE 400 so that the ANT terminal, the amplifier module 500, and the LNA output terminal are connected in order for the RFFE 400 to receive a signal. The communication processor 310 or RFFE 400 may be configured to switch the third switch 413 to the second state, the first switch 411 to the second state, and the second switch 412 to the first state by controlling the third switch 413, the first switch 411, and the second switch 412, so as to allow the ANT terminal, the amplifier module 500, and the LNA output terminal to be electrically connected. A signal input through the ANT terminal may pass through the CPL 440, the BPF 430, the third switch 413, and the first switch 411 and then be amplified by the amplifier module 500. The signal amplified by the amplifier module 500 may be output to the LNA output terminal through the second switch 412. A signal output to the LNA output terminal may be transmitted to the transceiver 320.

The power supply module 340 according to an embodiment may supply power to the RFFE 400 based on the control of the communication processor 310. The power supply module 340 may supply power to the RFFE 400 based on the control of the communication processor 310 according to the transmission/reception mode and/or the operation mode. For example, the power supply module 340 may supply power corresponding to the high gain reception mode to the RFFE 400 based on the control of the communication processor 310. For example, the power supply module 340 may supply power corresponding to the low-gain reception mode to the RFFE 400 based on the control of the communication processor 310.

Figure 8B:
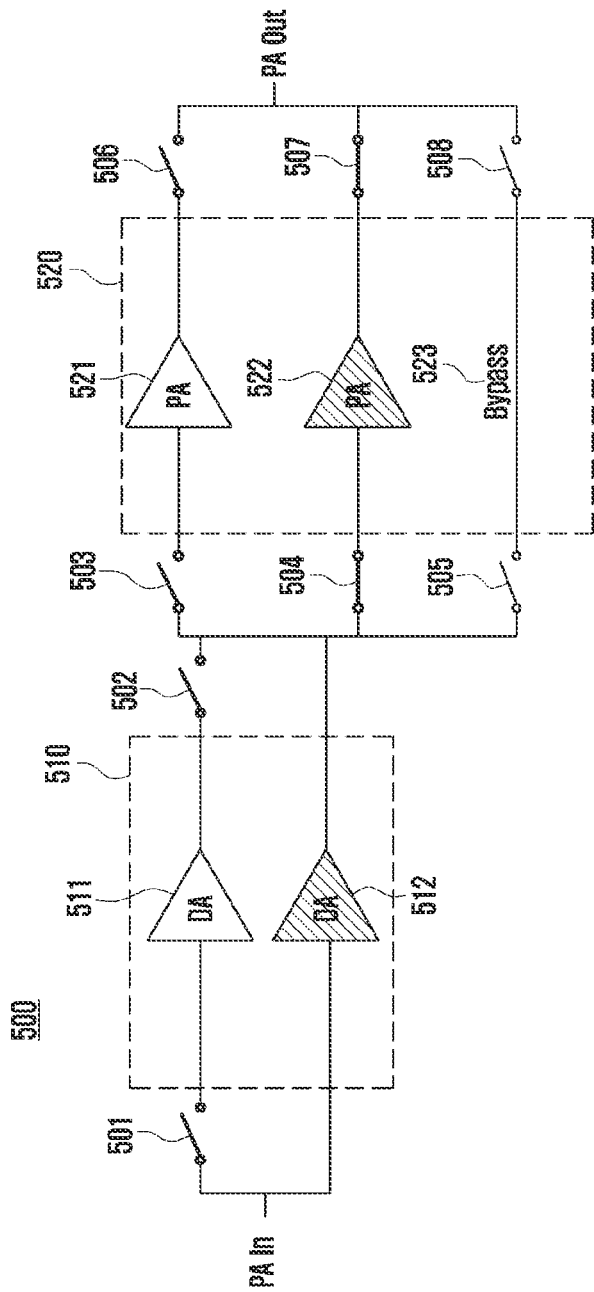
FIG. 8B is a block diagram of an example amplifier module, which is controlled by a communication processor in response to a high-gain reception mode, according to various embodiments.

FIG. 8B is a block diagram of the example amplifier module 500, which is controlled by the communication processor 310 in response to a high-gain reception mode according to various embodiments.

According to an embodiment, the communication processor 310 may control the amplifier module 500 so that the amplifier module 500 amplifies a signal, which is acquired from the antenna 350, with a high gain in response to a high-gain reception mode. For example, the communication processor 310 may control the amplifier module 500 so that a PA input terminal, a second drive amplifier 512, a second power amplifier 522, and a PA output terminal (PA out) are electrically connected in order for the amplifier module 500 to amplify a signal with a high gain. The communication processor 310 or amplifier module 500 may be configured to switch a first amplifier switch 501 to an opened state, a second amplifier switch 502 to an opened state, a third amplifier switch 503 to an opened state, a fourth amplifier switch 504 to a closed state, and a fifth amplifier switch 505 to an opened state by controlling the first amplifier switch 501, the second amplifier switch 502, the third amplifier switch 503, the fourth amplifier switch 504, and/or the fifth amplifier switch 505, so as to allow the PA input terminal (PA in), the second drive amplifier 512, the second power amplifier 522, and the PA output terminal (PA out) to be electrically connected. A signal input through the PA input terminal (PA in) may be amplified by the second drive amplifier 512. The signal amplified by the second drive amplifier 512 may be amplified through the second power amplifier 522. The signal, which is amplified by the second power amplifier 522, may be output through the PA output terminal (PA out) and then be transmitted to the transceiver 320.

Figure 8C:
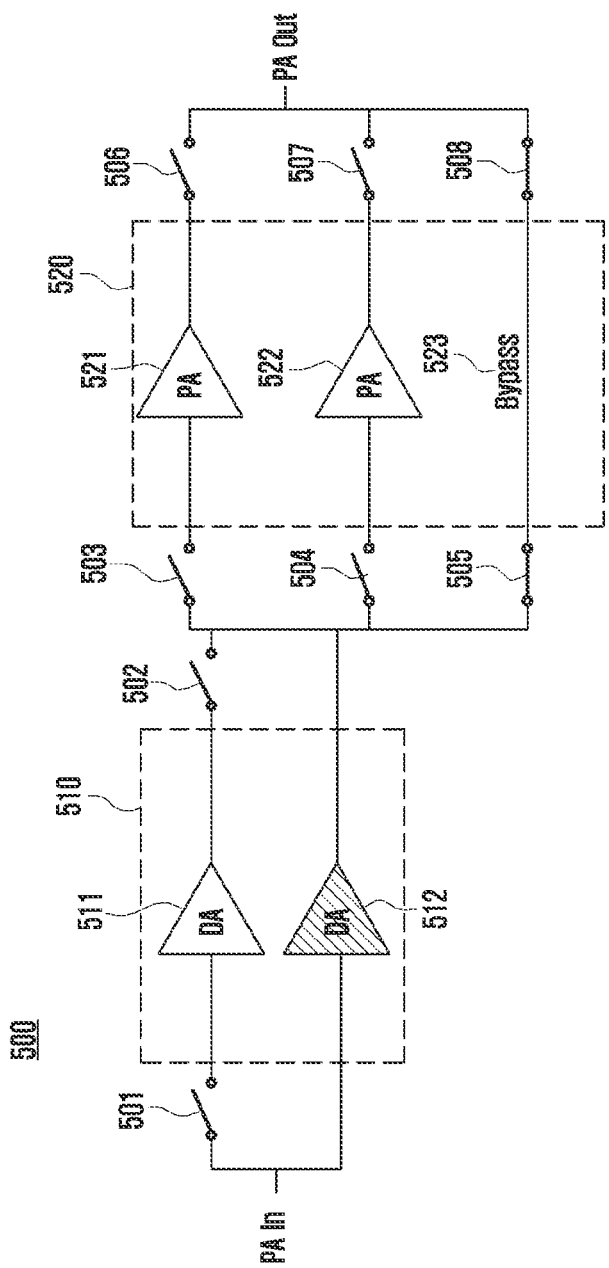
FIG. 8C is a block diagram of an example amplifier module, which is controlled by a communication processor in response to a low-gain reception mode according to various embodiments.

FIG. 8C is a block diagram of the example amplifier module 500, which is controlled by the communication processor 310 in response to a low-gain reception mode according to various embodiments.

According to an embodiment, the communication processor 310 may control the amplifier module 500 so that the amplifier module 500 amplifies a signal, which is acquired from the antenna 350, with a low gain in response to a low-gain reception mode. For example, the communication processor 310 may control the amplifier module 500 so that a PA input terminal, a second drive amplifier 512, and an output terminal are electrically connected in order for the amplifier module 500 to amplify a signal with a low gain. The communication processor 310 or amplifier module 500 may be configured to switch a first amplifier switch 501 to an opened state, a second amplifier switch 502 to an opened state, a third amplifier switch 503 to an opened state, a fourth amplifier switch 504 to an opened state, and a fifth amplifier switch 505 to a closed state by controlling the first amplifier switch 501, the second amplifier switch 502, the third amplifier switch 503, the fourth amplifier switch 504, and/or the fifth amplifier switch 505, so as to allow the PA input terminal (PA in), the second drive amplifier 512, and the PA output terminal (PA out) to be electrically connected. A signal input through the PA input terminal (PA in) may be amplified by the second drive amplifier 512. The signal, which is amplified by the second drive amplifier 512, may be output through the PA output terminal (PA out) and then transmitted to the transceiver 320.

An electronic device 300 various embodiments may include a communication processor 310, a transceiver 320, an antenna 350, a power supply module 340, and a communication circuit 400, in which the communication circuit 400 includes an input terminal (IN) configured to acquire a signal transmitted from the transceiver 320, an amplifier module 500, an output terminal (LNA Out) configured to transmit a signal to the transceiver 320, an antenna terminal (ANT) connected to the antenna 350, a first switch 411 connected to the input terminal (IN) and the amplifier module 500, a second switch 412 connected to the amplifier module 500 and the output terminal (LNA Out), and a third switch 413 connected to the first switch 411, the second switch 412, and the antenna terminal (ANT).

In the electronic device 300 according to various embodiments, the communication processor 310 may be configured to control the power supply module 340 and the communication circuit 400 based on a transmission/reception mode of a signal and an operation mode related to an amplification of a signal.

In the electronic device 300 according to various embodiments, the communication processor 310 may be configured to control the first switch 411, the second switch 412, and the third switch 413, based on the transmission/reception mode of the signal being a transmission mode, so as to connect the input terminal (IN), the amplifier module 500, and the antenna terminal (ANT) in the communication circuit 400.

In the electronic device 300 according to various embodiments, the communication processor 310 may be configured to control the first switch 411, the second switch 412, and the third switch 413, based on the transmission/reception mode of the signal being a reception mode, so as to connect the antenna terminal (ANT), the amplifier module 500, and the output terminal (LNA Out) in the communication circuit 400.

In the electronic device 300 according to various embodiments, the communication processor 310 may be configured to control the power supply module 340, based on the operation mode being a high-gain transmission mode, so as to supply power corresponding to the high-gain transmission mode to the communication circuit 400.

In the electronic device 300 according to various embodiments, the communication processor 310 may be configured to control the power supply module 340, based on the operation mode being a low-gain transmission mode, so as to supply power corresponding to the low-gain transmission mode to the communication circuit 400.

In the electronic device 300 according to various embodiments, the communication processor 310 may be configured to control the power supply module 340, based on the operation mode being a high-gain reception mode, so as to supply power corresponding to the high-gain reception mode to the communication circuit 400.

In the electronic device 300 according to various embodiments, the communication processor 310 may be configured to control the power supply module 340, based on the operation mode being a low-gain reception mode, so as to supply power corresponding to the low-gain reception mode to the communication circuit 400.

In the electronic device 300 according to various embodiments, the amplifier module 500 may include: an amplifier input terminal (PA In), a first amplifier group 510 including at least one amplifier, a second amplifier group 520 including at least one amplifier and a bypass path 523, and amplifying the signal amplified by the first amplifier, and an amplifier output terminal (PA Out) for outputting the amplified signal.

In the electronic device 300 according to various embodiments, the amplifier module 500 may be configured to, based on the transmission/reception mode and the operation mode, control the connection among the amplifier input terminal (PA In), the first amplifier group 510, the second amplifier group 520, and the amplifier output terminal (PA Out).

In the electronic device 300 according to various embodiments, the first amplifier group 510 may include at least one drive amplifier, and the second amplifier group 520 may include at least one power amplifier.

In the electronic device 300 according to various embodiments, the first amplifier group 510 may include a first drive amplifier 511 and a second drive amplifier 512, and the second amplifier group 520 may include a first power amplifier 521 and a second power amplifier 522.

In the electronic device 300 according to various embodiments, the communication processor 310 may be configured to control the amplifier module 500, in response to the transmission/reception mode and the operation mode being a high-gain transmission mode, so as to connect the amplifier input terminal (PA In), the first drive amplifier 511, the second drive amplifier 512, the first power amplifier 521, the second power amplifier 522, and the amplifier output terminal (PA Out) such that a transmission signal acquired through the amplifier input terminal (PA In) is amplified by the first drive amplifier 511 and the second drive amplifier 512, and the amplified signal is amplified by the first power amplifier 521 and the second power amplifier 522 and is output to the amplifier output terminal (PA Out).

In the electronic device 300 according to various embodiments, the communication processor 310 may be configured to control the amplifier module 500, in response to the transmission/reception mode and the operation mode being a low-gain transmission mode, so as to connect the amplifier input terminal (PA In), the first drive amplifier 511, the first power amplifier 521, and the amplifier output terminal (PA Out) such that a transmission signal acquired through the amplifier input terminal (PA In) is amplified by the first drive amplifier 511, and the amplified signal is amplified by the first power amplifier 521 and is output to the amplifier output terminal (PA Out).

In the electronic device 300 according to various embodiments, the communication processor 310 may be configured to control the amplifier module 500, in response to the transmission/reception mode and the operation mode being a high-gain reception mode, so as to connect the amplifier input terminal (PA In), the first drive amplifier 511, the first power amplifier 521, and the amplifier output terminal (PA Out) such that a reception signal acquired through the amplifier input terminal (PA In) is amplified by the first drive amplifier 511, and the amplified signal is amplified by the first power amplifier 521 and is output to the amplifier output terminal (PA Out).

In the electronic device 300 according to various embodiments, the communication processor 310 may be configured to control the amplifier module 500, in response to the transmission/reception mode and the operation mode being a low-gain reception mode, so as to connect the amplifier input terminal (PA In), the first drive amplifier 511, the bypass path, and the amplifier output terminal (PA Out) such that a reception signal acquired through the amplifier input terminal (PA In) is amplified by the first drive amplifier 511 and is output to the amplifier output terminal (PA Out).

An amplifier module 500 according to various embodiments may include an amplifier input terminal (PA In) configured to acquire a signal, a first amplifier group 510 including at least one first amplifier, a second amplifier group 520 including at least one second amplifier and a bypass 523 path, and amplifying a signal amplified by the first amplifier, and an amplifier output terminal (PA Out) configured to output the amplified signal, the amplifier module 500 is configured to control the connection among the amplifier input terminal (PA In), the first amplifier group 510, the second amplifier group 520, and the amplifier output terminal (PA Out), based on a transmission/reception mode of a signal and an operation mode related to an amplification magnification of a signal.

In the amplifier module 500 according to various embodiments, the first amplifier group 510 may include at least one drive amplifier, and the second amplifier group 520 may include at least one power amplifier.

In the amplifier module 500 according to various embodiments, the first amplifier group 510 may include a first drive amplifier 511 and a second drive amplifier 512, and the second amplifier group 520 may include a first power amplifier 521 and a second power amplifier 522.

In the amplifier module 500 according to various embodiments, the amplifier module 500 may be configured to, in response to the transmission/reception mode and the operation mode being a high-gain transmission mode, connect the amplifier input terminal (PA In), the first drive amplifier 511, the second drive amplifier 512, the first power amplifier 521, the second power amplifier 522, and the amplifier output terminal (PA Out) such that a transmission signal acquired through the amplifier input terminal (PA In) is amplified by the first drive amplifier 511 and the second drive amplifier 512, and the amplified signal is amplified by the first power amplifier 521 and the second power amplifier 522 and is output to the amplifier output terminal (PA Out).

In the amplifier module 500 according to various embodiments, the amplifier module 500 may be configured to, in response to the transmission/reception mode and the operation mode being a low-gain transmission mode, connect the amplifier input terminal (PA In), the first drive amplifier 511, the first power amplifier 521, and the amplifier output terminal (PA Out) such that a transmission signal acquired through the amplifier input terminal (PA In) is amplified by the first drive amplifier 511, and the amplified signal is amplified by the first power amplifier 521 and is output to the amplifier output terminal (PA Out).

In the amplifier module 500 according to various embodiments, the amplifier module 500 may be configured to, in response to the transmission/reception mode and the operation mode being a high-gain reception mode, connect the amplifier input terminal (PA In), the first drive amplifier 511, the first power amplifier 521, and the amplifier output terminal (PA Out) such that a reception signal acquired through the amplifier input terminal (PA In) is amplified by the first drive amplifier 511, and the amplified signal is amplified by the first power amplifier 521 and is output to the amplifier output terminal (PA Out).

In the amplifier module 500 according to various embodiments, the amplifier module 500 may be configured to, in response to the transmission/reception mode and the operation mode being a low-gain reception mode, connect the amplifier input terminal (PA In), the first drive amplifier 511, the bypass 523 path, and the amplifier output terminal (PA Out) such that a reception signal acquired through the amplifier input terminal (PA In) is amplified by the first drive amplifier 511 and is output to the amplifier output terminal (PA Out).

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" storage medium refers, for example, to a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a communication processor;
   a transceiver;
   an antenna;
   a power supply module; and
   a communication circuit operatively connected to the communication processor,
   wherein the communication circuit comprises:
      an input terminal configured to acquire a signal transmitted from the transceiver;
      an amplifier module configured as a single component, the amplifier module comprising:
         a first amplifier group including at least one drive amplifier configured to amplify the signal from the transceiver, and
         a second amplifier group including at least one power amplifier connected to the at least one drive amplifier and configured to amplify a signal from the first amplifier group;
      an output terminal configured to transmit a signal from the communication circuit to the transceiver;
      an antenna terminal connected to the antenna;
      a first switch connected to the input terminal and the amplifier module;
      a second switch connected to the amplifier module and the output terminal; and
      a third switch connected to the first switch, the second switch, and the antenna terminal,
   wherein the communication processor is configured to:
      control the first switch, the second switch, and the third switch to connect the at least one drive amplifier and the at least one power amplifier to the antenna during transmission mode, and to connect the at least one power amplifier to the antenna without connection with the at least one drive amplifier during reception mode such that a power gain during the transmission mode is higher than a power gain during the reception mode.

2. The electronic device of claim 1, wherein the communication processor is configured to control the first switch, the second switch, and the third switch, based on a transmission/reception mode of the signal being a transmission mode, so as to connect the input terminal, the amplifier module, and the antenna terminal in the communication circuit.

3. The electronic device of claim 2, wherein the communication processor is configured to control the power supply module, based on an operation mode being a high-gain transmission mode, so as to supply power corresponding to the high-gain transmission mode to the communication circuit.

4. The electronic device of claim 2, wherein the communication processor is configured to control the power supply module, based on an operation mode being a low-gain transmission mode, so as to supply power corresponding to the low-gain transmission mode to the communication circuit.

5. The electronic device of claim 1, wherein the communication processor is configured to control the first switch, the second switch, and the third switch, based on a transmission/reception mode of the signal being a reception mode, so as to connect the antenna terminal, the amplifier module, and the output terminal in the communication circuit.

6. The electronic device of claim 5, wherein the communication processor is configured to control the power supply module, based on an operation mode being a high-gain reception mode, so as to supply power corresponding to the high-gain reception mode to the communication circuit.

7. The electronic device of claim 5, wherein the communication processor is configured to control the power supply module, based on an operation mode being a low-gain reception mode, so as to supply power corresponding to the low-gain reception mode to the communication circuit.

8. The electronic device of claim 1, wherein the first amplifier group comprises a first drive amplifier and a second drive amplifier, and
   wherein the second amplifier group comprises a first power amplifier and a second power amplifier.

9. The electronic device of claim 8, wherein the communication processor is configured to control the amplifier module,
   in response to a transmission/reception mode and an operation mode being a high-gain transmission mode, so as to connect an amplifier input terminal, the first drive amplifier, the second drive amplifier, the first power amplifier, the second power amplifier, and an amplifier output terminal such that a transmission signal acquired through the amplifier input terminal is amplified by the first drive amplifier and the second drive amplifier, and the amplified signal is amplified by the first power amplifier and the second power amplifier and is output to the amplifier output terminal.

10. The electronic device of claim 8, wherein the communication processor is configured to control the amplifier module, in response to a transmission/reception mode and an operation mode being a low-gain transmission mode, so as to connect an amplifier input terminal, the first drive amplifier, the first power amplifier, and an amplifier output terminal such that a transmission signal acquired through the amplifier input terminal is amplified by the first drive amplifier, and the amplified signal is amplified by the first power amplifier and is output to the amplifier output terminal.

11. The electronic device of claim 8, wherein the communication processor is configured to control the amplifier module, in response to a transmission/reception mode and an operation mode being a high-gain reception mode, so as to connect an amplifier input terminal, the first drive amplifier, the first power amplifier, and an amplifier output terminal such that a reception signal acquired through the amplifier input terminal is amplified by the first drive amplifier, and the amplified signal is amplified by the first power amplifier and is output to the amplifier output terminal.

12. The electronic device of claim 8, wherein the communication processor is configured to control the amplifier module, in response to a transmission/reception mode and an operation mode being a low-gain reception mode, so as to connect an amplifier input terminal, the first drive amplifier, a bypass path, and an amplifier output terminal such that a reception signal acquired through the amplifier input terminal is amplified by the first drive amplifier and is output to the amplifier output terminal.

\* \* \* \* \*